United States Patent
Srinivasan et al.

(10) Patent No.: US 10,620,267 B2
(45) Date of Patent: Apr. 14, 2020

(54) CIRCUITRY FOR TESTING NON-MASKABLE VOLTAGE MONITOR FOR POWER MANAGEMENT BLOCK

(71) Applicant: STMicroelectronics International N.V., Schiphol (NL)

(72) Inventors: Venkata Narayanan Srinivasan, Gautam Budh Nagar District (IN); Srinivas Dhulipalla, Prakasam (IN)

(73) Assignee: STMicroelectronics International N.V., Schiphol (NL)

( * ) Notice: Subject to any disclaimer, the term of this patent is extended or adjusted under 35 U.S.C. 154(b) by 89 days.

(21) Appl. No.: 15/710,172

(22) Filed: Sep. 20, 2017

(65) Prior Publication Data

US 2019/0086474 A1 Mar. 21, 2019

(51) Int. Cl.
*G01R 31/327* (2006.01)
*H03K 19/20* (2006.01)
(Continued)

(52) U.S. Cl.
CPC ... *G01R 31/3277* (2013.01); *G01R 19/16552* (2013.01); *G01R 35/00* (2013.01); *H03K 19/20* (2013.01)

(58) Field of Classification Search
CPC ............................. G01R 31/3277; H03K 19/20
(Continued)

(56) References Cited

U.S. PATENT DOCUMENTS 5,721,502 A * 2/1998 Thomson .................. G06F 1/24
327/143
5,831,460 A * 11/1998 Zhou ..................... H03K 17/223
327/143
(Continued)

FOREIGN PATENT DOCUMENTS

CN 101208646 A 6/2008
CN 101860053 A 10/2010
(Continued)

OTHER PUBLICATIONS

First Office Action and Search Report from co-pending CN Appl. No. 201710954256.X dated Feb. 3, 2020 (6 pages).

*Primary Examiner* — Patrick Assouad
*Assistant Examiner* — Sean Curtis
(74) *Attorney, Agent, or Firm* — Crowe & Dunlevy

(57) ABSTRACT

A method of operating an electronic device during test mode operation of a duplicated voltage monitor includes sensing a functional supply voltage with a voltage monitor, deasserting an output of the voltage monitor if the functional supply voltage is exceeds a threshold, and asserting output of the voltage monitor if the functional supply voltage falls below the threshold. A test supply voltage is sensed with the duplicate voltage monitor, output of the duplicate voltage monitor is deasserted if the test supply voltage exceeds a threshold, and output of the duplicate voltage monitor is asserted if the test supply voltage falls below the threshold. Output of the duplicate voltage monitor is monitored to thereby determine the threshold based upon assertion of the (Continued)

output of the duplicate voltage monitor, and performing a logical operation between outputs of the voltage monitor and the duplicate voltage monitor to generate a power on reset signal.

26 Claims, 2 Drawing Sheets

(51) Int. Cl.
*G01R 19/165* (2006.01)
*G01R 35/00* (2006.01)

(58) Field of Classification Search
USPC .................. 324/424; 327/20, 143, 198, 545; 713/340; 714/34, 724
See application file for complete search history.

(56) References Cited

U.S. PATENT DOCUMENTS

| | | | | |
|---|---|---|---|---|
| 5,864,247 A * | 1/1999 | Hirano | ............... | G01R 19/0084 327/143 |
| 6,346,834 B1 * | 2/2002 | Chai | ................... | H03K 17/223 327/143 |
| 6,972,602 B2 * | 12/2005 | Akamatsu | ............ | H03K 17/223 327/143 |
| 7,015,732 B1 * | 3/2006 | Holloway | ........ | G01R 19/16552 327/143 |
| 7,821,307 B2 * | 10/2010 | Chellappa | .............. | H03K 17/22 327/142 |
| 8,344,767 B2 * | 1/2013 | Li | ........................ | H03K 17/223 327/143 |
| 8,531,194 B2 * | 9/2013 | Edwards | ............ | G01R 31/3004 324/713 |
| 8,629,713 B2 * | 1/2014 | Pietri | ..................... | H03K 17/22 327/143 |
| 8,896,370 B2 * | 11/2014 | Pietri | ..................... | H03K 17/22 327/143 |
| 9,395,775 B2 * | 7/2016 | Takayanagi | ............... | G06F 1/26 |
| 9,471,120 B1 * | 10/2016 | Thakur | ..................... | G06F 1/24 |
| 9,698,771 B1 * | 7/2017 | Srinivasan | ............... | H03K 5/19 |
| 9,941,875 B2 * | 4/2018 | Srinivasan | ............... | H03K 5/19 |
| 10,216,238 B2 * | 2/2019 | Ego | ........................... | G06F 1/24 |
| 2003/0062552 A1 * | 4/2003 | Takata | ...................... | G06F 1/24 257/295 |
| 2004/0212409 A1 * | 10/2004 | Akamatsu | ............ | H03K 17/223 327/143 |
| 2007/0170960 A1 * | 7/2007 | Sakai | ........................ | G06F 1/24 327/142 |
| 2007/0170962 A1 * | 7/2007 | Wu | ........................ | H03K 17/22 327/143 |
| 2008/0143543 A1 | 6/2008 | Vandensande et al. | | |
| 2010/0156477 A1 * | 6/2010 | Chellappa | ................ | G05F 3/30 327/143 |
| 2012/0092046 A1 * | 4/2012 | Li | ........................ | H03K 17/223 327/143 |
| 2012/0256664 A1 * | 10/2012 | Gunther | ............... | H03K 17/223 327/143 |
| 2014/0118036 A1 * | 5/2014 | Pietri | ..................... | H03K 17/22 327/143 |
| 2014/0380066 A1 * | 12/2014 | Takayanagi | ............... | G06F 1/26 713/300 |
| 2015/0378385 A1 * | 12/2015 | Rana | ......................... | G05F 3/16 327/143 |
| 2016/0056811 A1 * | 2/2016 | Wadhwa | ............... | H03K 17/223 327/143 |
| 2018/0013418 A1 * | 1/2018 | Srinivasan | ............... | H03K 5/19 |
| 2019/0086474 A1 * | 3/2019 | Srinivasan | ......... | G01R 31/3277 |
| 2019/0094301 A1 * | 3/2019 | Srinivasan | ....... | G01R 31/31851 |

FOREIGN PATENT DOCUMENTS

| | | |
|---|---|---|
| CN | 103928955 A | 7/2014 |
| CN | 204992539 U | 1/2016 |
| CN | 105452882 A | 3/2016 |
| CN | 106505265 A | 3/2017 |

\* cited by examiner

CIRCUITRY FOR TESTING NON-MASKABLE VOLTAGE MONITOR FOR POWER MANAGEMENT BLOCK

TECHNICAL FIELD

This disclosure is related to the field of electronic devices, and, more particularly, to the provision of a power management block having circuitry making it possible to test non-maskable voltage monitors without a tripping of these voltage monitors causing device reset.

BACKGROUND

Many electronic devices have certain built-in testing capabilities. For example, power management blocks may include one or more voltage supplies, and each voltage supply may have multiple voltage monitors associated therewith. The voltage monitors may have different thresholds (such as, for example, a HV supply over a range from 2.7V to 6V will have voltage monitors being associated with different thresholds such as 2.7V, 3.0V, . . . , 6V, a MV supply over a range from 1.5V to 2.4V will have voltage monitors being associated with different thresholds such as 1.5V, 1.6V, . . . , 2.4V, and a LV supply over a range from 0.7V to 1.15V will have voltage monitors being associated with different thresholds such as 0.7V, 0.8V, . . . , 1.15V). The voltage monitor associated with lowest threshold of each supply is non-maskable as the entire electronic device, including a power management block containing the voltage monitors, will be reset when it trips. Voltage monitors associated with other thresholds for all supplies are maskable during test operations, as tripping of these monitors does not reset the power management block and electronic devices are guaranteed to work until the trip point of the voltage monitor associated with lowest threshold. During test operations, the voltage monitors can be tested to determine at what voltage they trip by providing them with a variable test voltage instead of the voltage from their voltage supplies. The "trip" point can thus be determined.

However, as stated, this voltage trip output (if by a non-maskable voltage monitor) serves to reset the entire electronic device, including the power management block. Thus, with each test of a non-maskable voltage monitor, the electronic device must be powered up again. This adds to the time required to perform the testing, which in a production environment, is particularly undesirable.

Therefore, further development in the built-in testing capabilities of power management blocks is necessary.

SUMMARY

Described herein is a method of operating an electronic device during test mode operation of a duplicated voltage monitor by sensing a functional supply voltage with a voltage monitor, and deasserting an output of the voltage monitor if the functional supply voltage is exceeds a threshold, and asserting output of the voltage monitor if the functional supply voltage falls below the threshold. A test supply voltage is sensed with a duplicate voltage monitor, output of the duplicate voltage monitor is deasserted if the test supply voltage exceeds a threshold, and output of the duplicate voltage monitor is asserted if the test supply voltage falls below the threshold. Output of the duplicate voltage monitor is monitored to thereby determine the threshold based upon assertion of the output of the duplicate voltage monitor.

Described herein is also a method of operating an electronic device during test mode operation of a voltage monitor, the method including sensing a functional supply voltage with a duplicated voltage monitor, deasserting an output of the duplicated voltage monitor if the functional supply voltage is exceeds a threshold, and asserting output of the duplicated voltage monitor if the functional supply voltage falls below the threshold. A test supply voltage is sensed with a voltage monitor, output of the voltage monitor is deasserted if the test supply voltage exceeds a threshold, and output of the voltage monitor is asserted if the test supply voltage falls below the threshold. Output of the voltage monitor is monitored to thereby determine the threshold based upon assertion of the output of the voltage monitor.

A logical operation is performed between outputs of the voltage monitor and the duplicate voltage monitor to generate a power on reset (POR) signal.

The logical operation is performed such that output of a logic gate performing the logical operation remains deasserted where the test voltage falls below the threshold.

The logical operation may be an OR logic operation or a NAND logic operation.

The electronic device is reset if the output of the logic gate is asserted.

Also described herein is a method of operating an electronic device during power-up operation. Initially during power-up where a test mode select signal, test mode1 signal, and test mode2 signal are in an unknown state, and where a test supply voltage and functional supply voltage are below threshold, output of both a duplicated voltage monitor and a voltage monitor are asserted. The logical operation output is asserted and the entire electronic device including the power management block is reset which forces the test mode select signal, the test mode1 signal, and the test mode2 signal to be asserted (known state), thereby selecting the voltage monitor output to a power management unit and a system on a chip, and the functional voltage supply is to be sensed by a duplicated voltage monitor and a voltage monitor respectively.

Also disclosed herein is a device embodiment. The device includes a test input to be coupled to a test voltage supply, a functional voltage supply, a voltage monitor, and a duplicate voltage monitor. A first multiplexer has inputs coupled to the test input and the power supply, and an output coupled to an input of the duplicate voltage monitor. The first multiplexer is controlled as a function of a first test selection signal. A second multiplexer has inputs coupled to the test input and the power supply, and an output coupled to an input of the voltage monitor. The second multiplexer is controlled as a function of a second test selection signal. A logic gate has inputs coupled to the outputs of the first and second multiplexers and performing a logical operation on signals received therefrom.

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Figure 1:
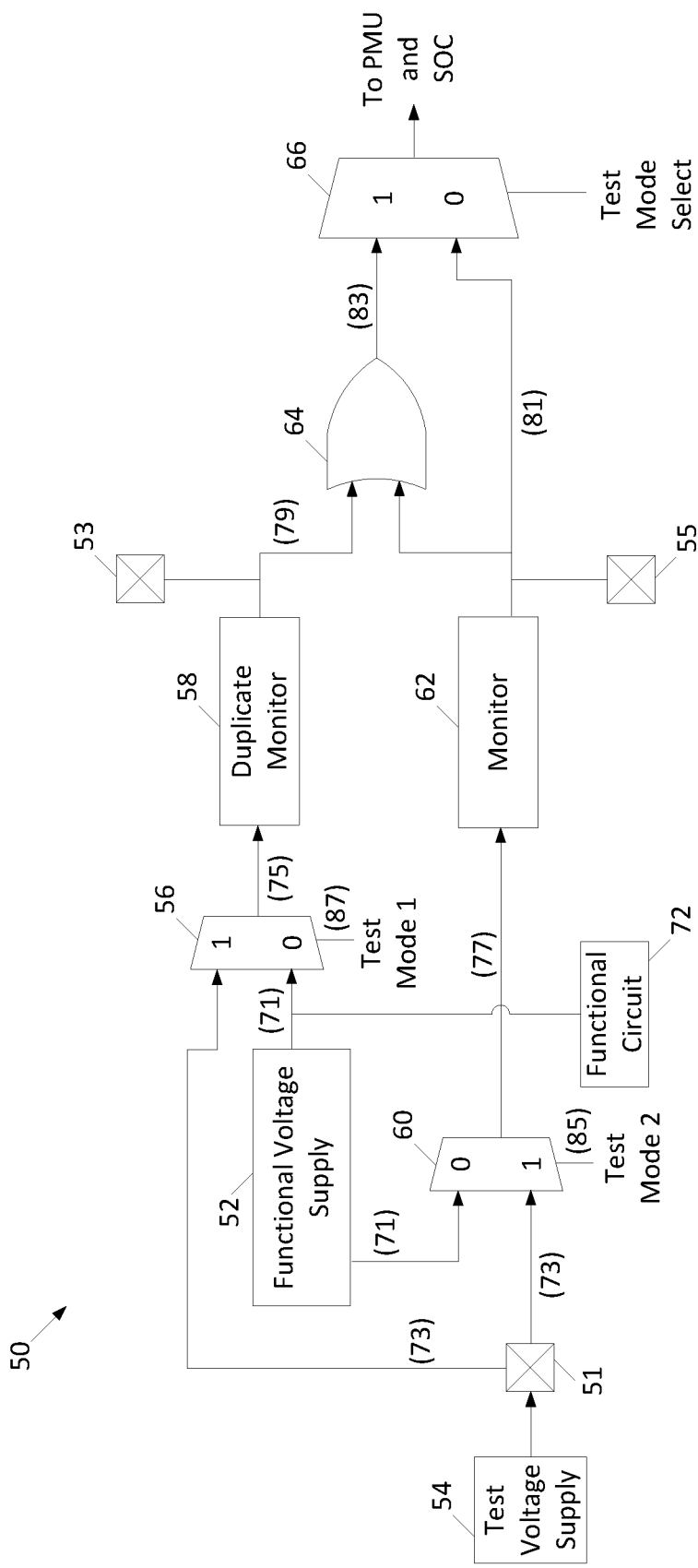
FIG. 1 is a schematic block diagram of a power management circuit including dual voltage monitors per voltage source, in accordance with this disclosure.

With reference to FIG. 1, a power management circuit 50 for an electronic device is now described. The power management circuit 50 includes a functional voltage supply 52 providing a functional voltage 71 to be used by a functional circuit of 72 the electronic device. The functional voltage supply 52 provides the functional voltage 71 to first inputs of the multiplexers 56 and 60. The second inputs of the multiplexers 56 and 60 are coupled to the test input pad 51, which is illustratively coupled to receive a test voltage 73 from a test voltage supply 54. The test voltage supply 54 is applied to the test input pad 51 during test operations.

The output signal 77 from the multiplexer 60 is coupled to a voltage monitor 62. The output signal 75 from the multiplexer 56 is coupled to a duplicate voltage monitor 58, which has substantially similar operating characteristics to that of voltage monitor 62, which is to say that the voltage monitors 58 and 62 are each designed to and configured "trip" (assert their output by changing their output from a first logic level to a second level) when signals input thereto fall below a same threshold voltage.

The outputs signals 81 and 79 of the voltage monitor 62 and the duplicate voltage monitor 58, respectively, are coupled to the inputs of an OR gate 64, as well as to output pads 55 and 53. The output signal 83 from the OR gate 64 is coupled to a second input of a multiplexer 66. The output signal 81 from the voltage monitor 62 is also coupled to a first input of the multiplexer 66. The multiplexer 66 provides output in the form of a power on reset (POR) signal to the remainder of the power management unit 50, and/or to a system on a chip (SOC).

Operation of the power management circuit 50 is now described. In a normal operation mode, a test mode select signal that controls the multiplexer 66 is at the second logic level, and a test mode signal 85 that controls the multiplexer 60 is at the second logic level. As a result, the functional supply voltage 71 from the functional voltage supply 52 is passed through the multiplexer 60 to the voltage monitor 62. Provided that the functional supply voltage 71 is not below the threshold voltage, the output of the voltage monitor 62 remains at a first logic level, and passed by the multiplexer 66 to the remainder of the power management unit 50, and/or to a SOC (i.e. the POR signal is not asserted).

However, in test mode, it is desired to test the operation of the voltage monitor 62 and/or the duplicate voltage monitor 58, in a fashion that inhibits the multiplexer 66 from providing output (i.e. asserting the POR signal) that results in a reset sequence of the electronic device. Therefore, to test the voltage monitor 62 in test mode, the test voltage 73 is applied from the test voltage supply 54 to the test input pad 51, the test mode select signal is at the first logic level, the test mode signal 85 that controls the multiplexer 60 is at the first logic level, and a test mode signal 87 that controls the multiplexer 56 is at the second logic level. This results in the test voltage 73 being passed by the multiplexer 60 to the voltage monitor 62, and the functional voltage 71 being passed by the multiplexer 56 to the duplicate voltage monitor 58. Provided that the functional voltage supply 52 is functioning properly, the duplicate monitor 58 will not trip, meaning that the output signal 83 from the OR gate 64 remains at the first logic level, and that the reset sequence is not initiated (i.e. the POR signal is not asserted). If the output signal 83 were asserted (at the second logic level), then the reset sequence would be initiated (i.e. the POR signal would be asserted).

During the testing, the test voltage 73 may be varied by the test voltage supply 54, such as by being reduced, until the monitor 62 trips. This trip point of the monitor 62 may be determined by monitoring the pad 55 together with the test voltage 73. The test voltage 73 present when the signal at the pad 55 is asserted (switched to the second logic level) is the point at which the monitor 62 trips. Thus, through the use of this circuit 50, testing of the voltage monitor 62 during test mode, without initiating the reset sequence, is enabled. OR gate 64 is of particular importance here, since signal 83 remains at the first logic level even though monitor 62 has tripped and signal 81 is at the second logic level. POR then remains deasserted.

To test the duplicate voltage monitor 58 in test mode, the test voltage 73 is applied from the test voltage supply 54 to the test input pad 51, the test mode select signal is at the first logic level, the test mode signal 85 that controls the multiplexer 60 is at the second logic level, and the test mode signal 87 that controls the multiplexer 56 is at the first logic level. This results in the test voltage 73 being passed by the multiplexer 56 to the duplicate voltage monitor 58, and the functional voltage 71 being passed by the multiplexer 60 to the voltage monitor 62. Provided that the functional voltage supply 52 is functioning properly, the voltage monitor 62 will not trip, meaning that the output signal 83 from the OR gate 64 remains at the first logic level, and that the reset sequence is not initiated.

During the testing, the test voltage 73 may be varied by the test voltage supply 54, such as by being reduced, until the duplicate voltage monitor 58 trips. This trip point of the duplicate voltage monitor 58 may be determined by monitoring the pad 53 together with the test voltage 73. The test voltage 73 present when the signal at the pad 53 is asserted is the point at which the duplicate voltage monitor 58 trips. Thus, through the use of this circuit 50, testing of the duplicate voltage monitor 58 during test mode, without initiating the reset sequence, is also enabled.

It is noted that the functional voltage supply 52 may be any voltage supply within the electronic device, such as a high voltage supply, a medium voltage supply, a low voltage supply, a main supply voltage, or a standby supply voltage.

Figure 2:
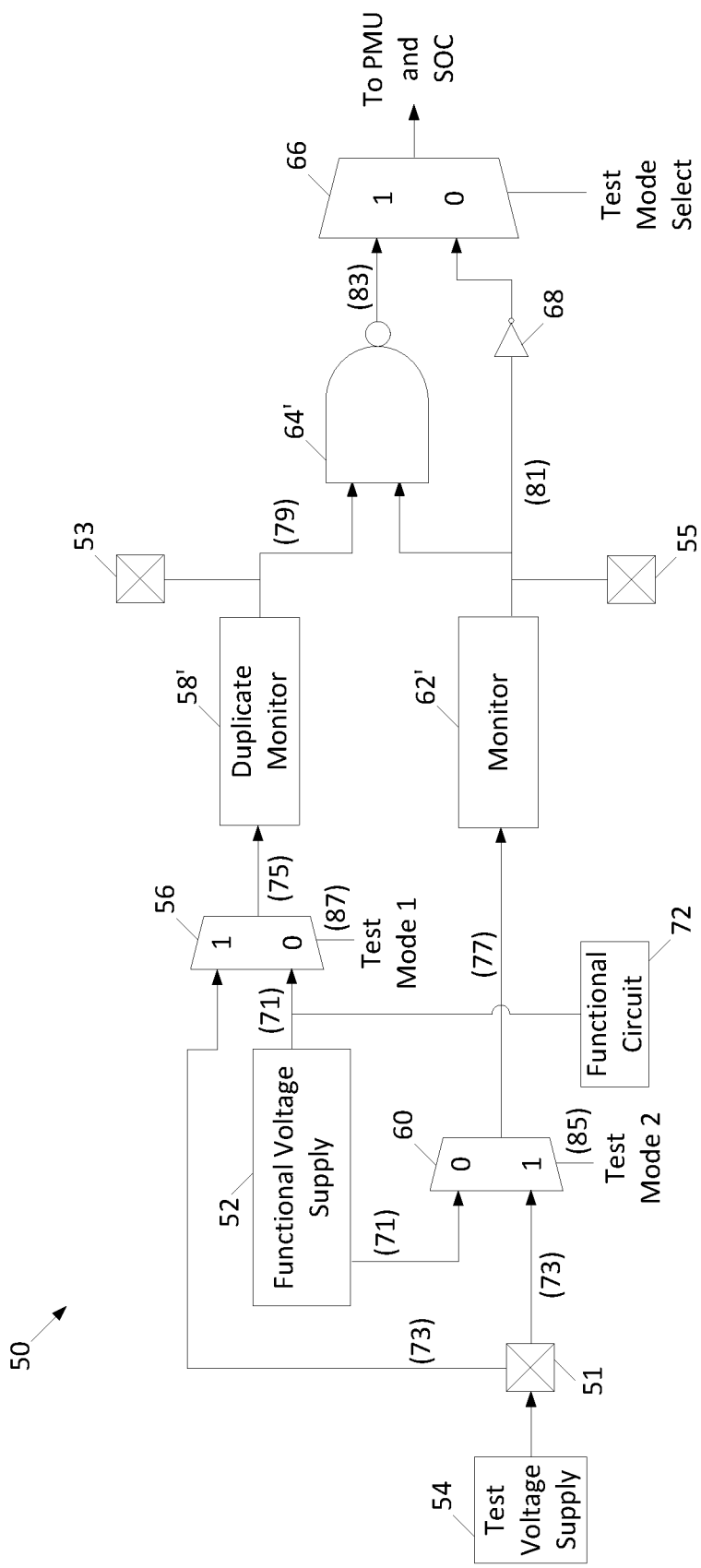
FIG. 2 is a schematic block diagram of another embodiment of a power management circuit including dual voltage monitors per voltage source, in accordance with this disclosure.

It should be noted that in some cases, the voltage monitor 62 and duplicate voltage monitor 58 may assert their outputs by switching from the second logic level to the first logic level, instead of from the first logic level to the second logic level. Such an embodiment is shown in FIG. 2. It is noted that this circuit 50' is otherwise identical the circuit 50 of FIG. 1, except that the logic gate 64' is here a NAND gate instead of an OR gate, and, as stated, the voltage monitor 62' and duplicate voltage monitor 58' assert their outputs by switching from the second logic level to the first logic level.

It should be noted that the duplicate voltage monitor is added also to ensure that the entire electronic device, including the power management block, is reset at power-up so that the test mode select signal, the test mode 1 signal, and the test mode 2 signal are initialized, thereby allowing the electronic device including power management block to perform functional operations. Thereafter, test mode operation may be entered by deasserting the test mode select signal and the required one of test mode 1 signal or the test mode 2 signal.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

The invention claimed is:

1. A method of operating an electronic device, comprising: during a normal mode of operation, sensing a functional supply voltage with a voltage monitor; during a test mode operation of a duplicated voltage monitor: sensing the functional supply voltage with the voltage monitor; deasserting an output of the voltage monitor if the functional supply voltage is exceeds a threshold, and asserting output of the voltage monitor if the functional supply voltage falls below the threshold; sensing a test supply voltage with the duplicate voltage monitor; deasserting output of the duplicate voltage monitor if the test supply voltage exceeds a threshold, and asserting output of the duplicate voltage monitor if the test sup ply voltage falls below the threshold; and monitoring output of the duplicate voltage monitor to thereby determine the threshold based upon assertion of the output of the duplicate voltage monitor; and performing a logical operation between outputs of the voltage monitor and the duplicate voltage monitor to generate a power on reset (POR) signal.

2. The method of claim 1, further comprising: during a test mode operation of the voltage monitor: sensing the functional supply voltage with the duplicated voltage monitor; deasserting the output of the duplicated voltage monitor if the functional supply voltage exceeds a threshold voltage, and asserting the output of the duplicated voltage monitor if the functional supply voltage falls below the threshold voltage; sensing the test supply voltage with the voltage monitor; deasserting the output of the voltage monitor if the test supply voltage exceeds the threshold voltage, and asserting the output of the voltage monitor if the test supply voltage falls below the threshold voltage; and monitoring the output of the voltage monitor to thereby determine the threshold voltage based upon assertion of the output of the voltage monitor.

3. The method of claim 1, wherein the logical operation is performed such that output of a logic gate performing the logical operation remains deasserted where the test supply voltage falls below the threshold.

4. The method of claim 1, wherein the logical operation comprises an OR logic operation.

5. The method of claim 1, wherein the logical operation comprises a NAND logic operation.

6. The method of claim 3, further comprising resetting the electronic device if the output of the logic gate is asserted.

7. The method of claim 1, wherein during an initial power-up phase, the voltage monitor and the duplicated voltage monitor remain asserted thereby resetting the electronic device to a known state to allow the electronic device to perform functional operations, and to thereafter enter the test mode operation.

8. A method of operating an electronic device, comprising:
initiating executing a reset sequence of the electronic device based upon an output a power source fault signal being asserted; generating the output a power source fault signal in a normal mode of operation based upon a functional supply voltage, wherein the output power source fault signal is asserted in the normal mode of operation of the functional supply voltage falls below a threshold; and generating the output power source fault signal in a test mode of operation as being asserted based upon both the functional supply voltage and a test supply voltage being below the threshold.

9. The method of claim 8, wherein generating the output power source fault signal in the normal mode of operation comprises: receiving the functional supply voltage at a first voltage monitor, and asserting the output power source fault signal at an output of the first voltage monitor based upon the functional supply voltage being below the threshold.

10. The method of claim 8, wherein generating the output power source fault signal in the test mode of operation comprises: receiving the functional supply voltage at a first voltage monitor, and asserting a first monitor signal at an output of the first voltage monitor if the functional supply voltage is below the threshold; receiving the test supply voltage at a second voltage monitor, and asserting a second monitor signal at an output of the second voltage monitor if the test supply voltage is below the threshold; and generating the output power source fault signal as a function of a logical OR between the first and second monitor signals.

11. The method of claim 8, wherein generating the output power source fault signal in the test mode of operation comprises: receiving the test supply voltage at a first voltage monitor, and asserting a first monitor signal at an output of the first voltage monitor if the test supply voltage is below the threshold; receiving the functional supply voltage at a second voltage monitor, and asserting a second monitor signal at an output of the second voltage monitor if the functional supply voltage is below the threshold; and generating the output power source fault signal as a function of a logical operation between the first and second monitor signals.

12. The method of claim 11, wherein the logical operation is a logical OR operation.

13. The method of claim 8, wherein generating the output power source fault signal in the test mode of operation comprises: receiving the test supply voltage at a first voltage monitor in a first test mode and receiving the functional supply voltage at the first voltage monitor in a second test mode; asserting a first monitor signal at an output of the first voltage monitor if the test supply voltage is below the threshold in the first test mode and asserting the first monitor signal at the output of the first voltage monitor if the functional supply voltage is below the threshold in the second test mode; receiving the test supply voltage at a second voltage monitor in a second test mode and receiving the functional supply voltage at the second voltage monitor in a first test mode; asserting a second monitor signal at an output of the second voltage monitor if the test supply voltage is below the threshold in the second test mode and asserting the second monitor signal at the output of the second voltage monitor if the functional supply voltage is below the threshold in the first test mode; and generating the output power source fault signal as a function of a logical operation between the first and second monitor signals.

14. The method of claim 11, wherein the logical operation is a logical OR operation.

15. An electronic device, comprising: a test input to be coupled to a test voltage supply; a functional voltage supply; a voltage monitor; a duplicate voltage monitor; a first multiplexer having inputs coupled to the test input and the functional voltage a power supply, and an output coupled to an input of the duplicate voltage monitor, wherein the first multiplexer is controlled as a function of a first test selection signal; a second multiplexer having inputs coupled to the test input and the functional voltage power supply, and an output coupled to an input of the voltage monitor, wherein the second multiplexer is controlled as a function of a second test selection signal; and a logic gate having inputs coupled to the outputs of the duplicate voltage monitor and the voltage monitor and performing a logical operation on signals received therefrom.

16. The electronic device of claim 15, wherein the logic gate is an OR gate.

17. The electronic device of claim 15, wherein the logic gate is a NAND gate.

18. The electronic device of claim 15, wherein the duplicate voltage monitor outputs a first logic value where the output of the first multiplexer is above a threshold voltage, and outputs a second logic value where the output of the first multiplexer is be low the threshold voltage; wherein the voltage monitor outputs the first logic value where the output of the second multiplexer is above the threshold voltage, and outputs a second logic value where the output of the second multiplexer is below the threshold voltage; and wherein output of the logic gate remains at a first logic level where one of the first and second test selection signals is at the first logic level and a voltage applied to the test input results in output of the first multiplexer or the second multiplexer falling below the threshold voltage.

19. The electronic device of claim 16, further comprising a third multiplexer having inputs coupled to an output of the OR gate and to the output of the voltage monitor, and an output coupled to additional circuitry, wherein the third multiplexer is controlled as a function of a test mode signal such that the output of the logic gate is passed by the third multiplexer when the test mode signal is asserted.

20. The electronic device of claim 15, further comprising a first output pad coupled to the output of the duplicate voltage monitor and a second output pad coupled to the output of the voltage monitor.

21. The electronic device of claim 15, wherein the duplicate voltage monitor has substantially similar operating characteristics to the voltage monitor.

22. An electronic device, comprising: a first voltage monitor configured to deassert its output if a voltage at its input is above a threshold, and to assert its output if the voltage at its input is not above the threshold; a second voltage monitor configured to deassert its output if a voltage at its input is above a threshold, and to assert its output if the voltage at its input is not above the threshold; a first voltage selection circuit configured to provide a test voltage to the input of the first voltage monitor in a first test mode, and to provide a functional voltage to the input of the first voltage monitor in a second test mode; a second voltage selection circuit configured to provide a test voltage to the input of the second voltage monitor in a second test mode, and to provide a functional voltage to the input of the second voltage monitor in a first test mode; an OR gate configured to perform a logical OR on outputs of the first and second voltage monitors; and circuitry configured to receive a result of the logical OR and to reset if the result of the logical OR is asserted.

23. The electronic device of claim 22, wherein the first voltage selection circuit comprises a first multiplexer having inputs coupled to receive the test voltage and the functional voltage, having an output coupled to the first voltage monitor, and being controlled as a function of the first and second test modes.

24. The electronic device of claim 22, wherein the second voltage selection circuit comprises a second multiplexer having inputs coupled to receive the test voltage and the functional voltage, having an output coupled to the second voltage monitor, and being controlled as a function of the first and second test modes.

25. The electronic device of claim 22, further comprising a multiplexer configured to pass the result of the logical OR to the circuitry when a test mode signal is asserted, and to pass the output of the second voltage monitor to the circuitry when the test mode signal is not asserted.

26. The electronic device of claim 22, further comprising a first output pad coupled to the output of the first voltage monitor and a second output pad coupled to the output of the second voltage monitor.

* * * * *

UNITED STATES PATENT AND TRADEMARK OFFICE
CERTIFICATE OF CORRECTION

PATENT NO. : 10,620,267 B2
APPLICATION NO. : 15/710172
DATED : April 14, 2020
INVENTOR(S) : Venkata Narayanan Srinivasan et al.

It is certified that error appears in the above-identified patent and that said Letters Patent is hereby corrected as shown below:

In the Claims

At Column 5, Claim No. 1, Line 21, please replace [[sup ply]] with --supply--.
At Column 5, Claim No. 8, Line 61, please delete the word "executing".
At Column 5, Claim No. 8, Line 62, please delete the phrase "a power source fault".
At Column 5, Claim No. 8, Lines 63-64, please delete the phrase "a power source fault".
At Column 5, Claim No. 8, Lines 65-66, please delete the phrase "a power source fault".
At Column 6, Claim No. 8, Line 1, please delete the phrase "power source fault".
At Column 6, Claim No. 9, Line 6, please delete the phrase "power source fault".
At Column 6, Claim No. 9, Line 8, please delete the phrase "power source fault".
At Column 6, Claim No. 10, Line 12, please delete the phrase "power source fault".
At Column 6, Claim No. 10, Line 20, please delete the phrase "power source fault".
At Column 6, Claim No. 11, Line 23, please delete the phrase "power source fault".
At Column 6, Claim No. 11, Line 31, please delete the phrase "power source fault".
At Column 6, Claim No. 13, Line 37, please delete the phrase "power source fault".
At Column 6, Claim No. 13, Line 55, please delete the phrase "power source fault".

Signed and Sealed this
Fifteenth Day of December, 2020

Andrei Iancu
*Director of the United States Patent and Trademark Office*